United States Patent
Finkel et al.

(10) Patent No.: US 8,604,676 B1
(45) Date of Patent: Dec. 10, 2013

(54) CRYSTALLINE RELAXOR-FERROELECTRIC PHASE TRANSITION TRANSDUCER

(75) Inventors: Peter Finkel, Downington, PA (US); Ahmed H. Amin, North Attleboro, MA (US); Kim C. Benjamin, Portsmouth, RI (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 291 days.

(21) Appl. No.: 13/053,577

(22) Filed: Mar. 22, 2011

(51) Int. Cl.
*H01L 41/187* (2006.01)

(52) U.S. Cl.
CPC .......... *H01L 41/187* (2013.01); *H01L 41/1876* (2013.01)
USPC ........................................................ 310/358

(58) Field of Classification Search
CPC .............. H01L 41/187; H01L 41/1871; H01L 41/1873; H01L 41/1875; H01L 41/1876; H01L 41/1878
USPC ........................ 310/358; 252/62.9 R, 62.9 PZ
See application file for complete search history.

(56) References Cited

U.S. PATENT DOCUMENTS

| | | | |
|---|---|---|---|
| 5,408,168 A * | 4/1995 | Pfandler | 318/642 |
| 6,995,496 B1 * | 2/2006 | Hagood et al. | 310/317 |
| 2008/0265718 A1 * | 10/2008 | Sakashita et al. | 310/358 |
| 2010/0066205 A1 * | 3/2010 | Higashionji et al. | 310/323.02 |

OTHER PUBLICATIONS

Chiaki Okawara and Ahmed Amin, DC Field Effect on Stability of Piezoelectric PZN-0.06PT Single Crystals Under Compressive Stress, paper, Aug. 19, 2009 pp. 95,072902-01-03, American Institute of Physics, USA.

* cited by examiner

*Primary Examiner* — Derek Rosenau
(74) *Attorney, Agent, or Firm* — James M. Kasischke; Michael P. Stanley

(57) ABSTRACT

A piezoelectric transducer includes a single crystal piezoelectric material having a phase transition from one crystalline phase to a second crystalline phase at a predetermined stress level. A pre-stress is applied to the single crystal piezoelectric material so that the material is maintained near its phase transition point. An electrical field source is joined to the material such that, in cooperation with the pre-stress, an increase or decrease in the electrical field causes a crystalline phase transition in the single crystal piezoelectric material. Crystalline phase transition induces strain larger by an order of magnitude than that caused by the non-phase transition piezoelectric effect.

10 Claims, 4 Drawing Sheets

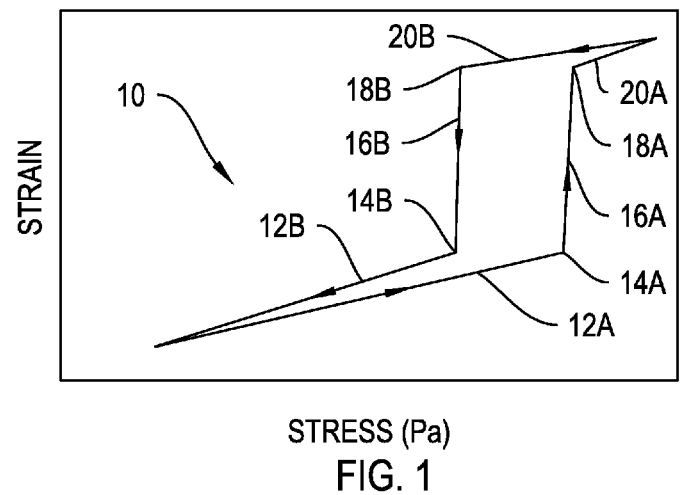
FIG. 1
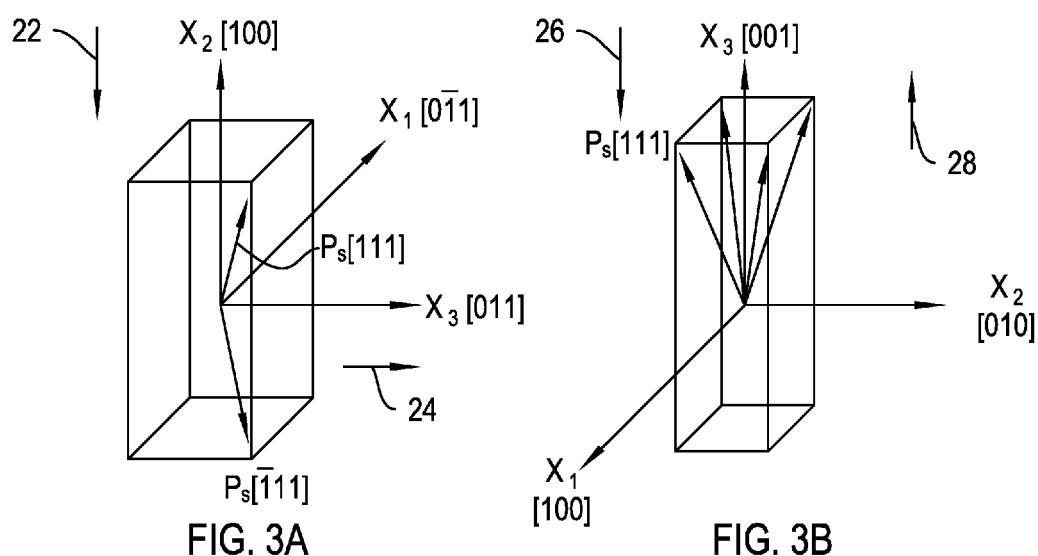
FIG. 3A
FIG. 3B

CRYSTALLINE RELAXOR-FERROELECTRIC PHASE TRANSITION TRANSDUCER

STATEMENT OF GOVERNMENT INTEREST

The invention described herein may be manufactured and used by or for the Government of the United States of America for governmental purposes without the payment of any royalties thereon or therefor.

CROSS REFERENCE TO OTHER PATENT APPLICATIONS

None.

BACKGROUND OF THE INVENTION (1) Field of the Invention

The present invention is directed generally towards piezoelectric transducers, and in particular, to a piezoelectric transducer that uses a crystalline phase transformation to achieve improved elongation.

(2) Description of the Prior Art

Most transduction devices are based on strain produced in a piezoelectric or magnetostrictive material. These materials can produce relatively large strain in a linear region, but in order to develop high strain they must be driven by a very high electric or magnetic field. There are several other classes of materials utilizing high strain associated with martensitic phase transition (namely, shape memory alloys). However, high strain in shape memory alloys (SMA) is thermally activated, and transduction devices based on these materials have frequency band limitations. For this reason, piezoelectric and magnetostrictive materials are most often used in transducer applications.

The current most promising class of transducer materials are relaxor-ferroelectric piezoelectric single crystals. These materials are single crystals of piezoelectric materials (for example, lead zinc niobate-lead titanate, known hereinafter as PZN-PT). These materials have been shown to deliver extraordinarily high strain when an external electric field is applied as compared to conventional polycrystalline piezoceramic.

In some special compositions (for example ternary lead indium niobate-lead magnesium niobate-lead titanate (PIN-PMN-PT)), the material will undergo a phase transformation accompanied by a very sharp hysteretic strain and a dramatic change in stiffness when subjected to external stress. This phase transformation can be invoked repeatedly at variable rates to induce large strains in the single crystal element. Known compositions exhibiting this type of phase change behavior include (1−x)PZN-xPT where 0.04<x<0.11. The composition where x was 0.06 has been tested at multiple temperatures and applied direct current (DC) bias fields. Under these conditions, it has been shown to exhibit a phase transformation.

It is known to combine single crystal piezoelectric materials with mechanical stress inducing means. This is typically performed in order to avoid putting the piezoelectric material in tensile stress because of the fragility of ceramic materials in tension. In a prior art mechanically induced stress application, the stress is calculated to be that which is optimal for insuring piezoelectric material life in the operating conditions of the application. These operating conditions can include varying environmental temperatures and pressures.

It is also known to include an electrically controllable stress element in combination with a piezoelectric single crystal material. This element can be either a piezoelectric (voltage driven) element or a magnetostrictive effect (MS) element. These hybrid magnetostrictive-piezoelectric transducer systems are known to work effectively in a linear region.

In both mechanical and electrical stress generation means, applications avoid utilizing stress near the phase transition stress level. This is because the piezoelectric material shows a non-linear response at this level that may be triggered by environmental temperature or pressure.

SUMMARY OF THE INVENTION

It is an object of the present invention to provide transducer that has a strain response to an electric field that is much greater than heretofore known.

It is a further object of the present invention to provide a transducer utilizing a crystalline phase transition as its mode of operation.

Accordingly, there is provided a piezoelectric transducer that includes a single crystal piezoelectric material having a phase transition from one crystalline phase to a second crystalline phase at a predetermined stress level. A pre-stress is applied to the single crystal piezoelectric material so that the material is maintained near its phase transition point. An electrical field source is joined to the material such that, in cooperation with the pre-stress, an increase or decrease in the electrical field causes a crystalline phase transition in the single crystal piezoelectric material.

BRIEF DESCRIPTION OF THE DRAWINGS

Other objects, features and advantages of the present invention will become apparent upon reference to the following description of the preferred embodiments and to the drawings, wherein corresponding reference characters indicate corresponding parts throughout the several views of the drawings and wherein:

FIG. 1 is a graph showing strain versus stress for a representative phase change piezoelectric material;

FIG. 3A is a perspective view of a first crystal orientation of a phase change piezoelectric crystal operating in the "32" mode;

FIG. 3B is a perspective view of a second crystal orientation of a phase change piezoelectric crystal operating in the "33" mode;

DETAILED DESCRIPTION OF THE INVENTION

This invention utilizes single crystal piezoelectric materials, known more specifically as relaxor-ferroelectric single crystal compositions, which operate near the morphotropic phase boundary (MPB). In these types of crystals, the morphotropic phase boundary is the temperature/pressure region in which the crystalline structure changes from a rhombohedral structure to a tetragonal structure through intermediate states. In this process, energy is stored in the crystal before the phase change, and this energy is suddenly released during the phase change. Binary materials showing this transition include $(1-x)Pb(B'_{1/3}Nb_{2/3})O_3\text{-}xPbTiO_3$ where B' is Mg, Mn, Zn, or Sc. One known material in this range, that is useful for this purpose incorporates Zn as B', and x is in the range of $0.04<x<0.11$. Ternary single crystal compositions, such as $xPb(In_{1/2}Nb_{1/2})O_3\text{-}(1\text{-}x\text{-}y)Pb(Mg_{1/3}Nb_{2/3})O_3\text{-}yPbTiO_3$ (PIN-PMN-PT), also show these properties. Useful crystals in this group have been found where x is in the range of 0.24-0.33 and y is in the range of 0.28-0.33. Other ranges and similar compositions of binary and ternary crystals may have beneficial properties. A particularly desirable characteristic of these materials is a sharp phase transition.

FIG. 1 is a graph that generically depicts a hysteresis curve 10 of a single crystal material having a sharp elastic instability near the phase transition point. As compressive stress increases in the material, strain response increases linearly in region 12A. A phase transition point occurs at 14A. During phase transition the response is shown as indicated at 16A. Strain response is rapid during phase transition. The phase transition completes as indicated at 18A and a second linear region begins as indicated at 20A. As compressive stress is reduced, strain declines linearly in region 20B. Once stress declines sufficiently, a phase transition occurs at 18B. The response during phase transition is shown at 16B, and phase transition completes at 14B. The response enters the linear region at 12B as stress declines further. For a given material, the position of this curve and its inflection points depend on pressure, temperature and the electrical field to which the material is subjected.

A pronounced strain change such as that indicated at 14A and 14B is essential for the proposed transducer. This jump can be induced by any possible external driving element. For example, this driving element can be a magnetostrictive element driven by a magnetic field generated in a coil. Alternatively, this can be secondary driving piezoelectric element or the single crystal element can be preloaded to a certain critical stress. The critical stress is a characteristic of the particular material composition, and it can be determined experimentally for given temperature and electric field.

Figure 2:
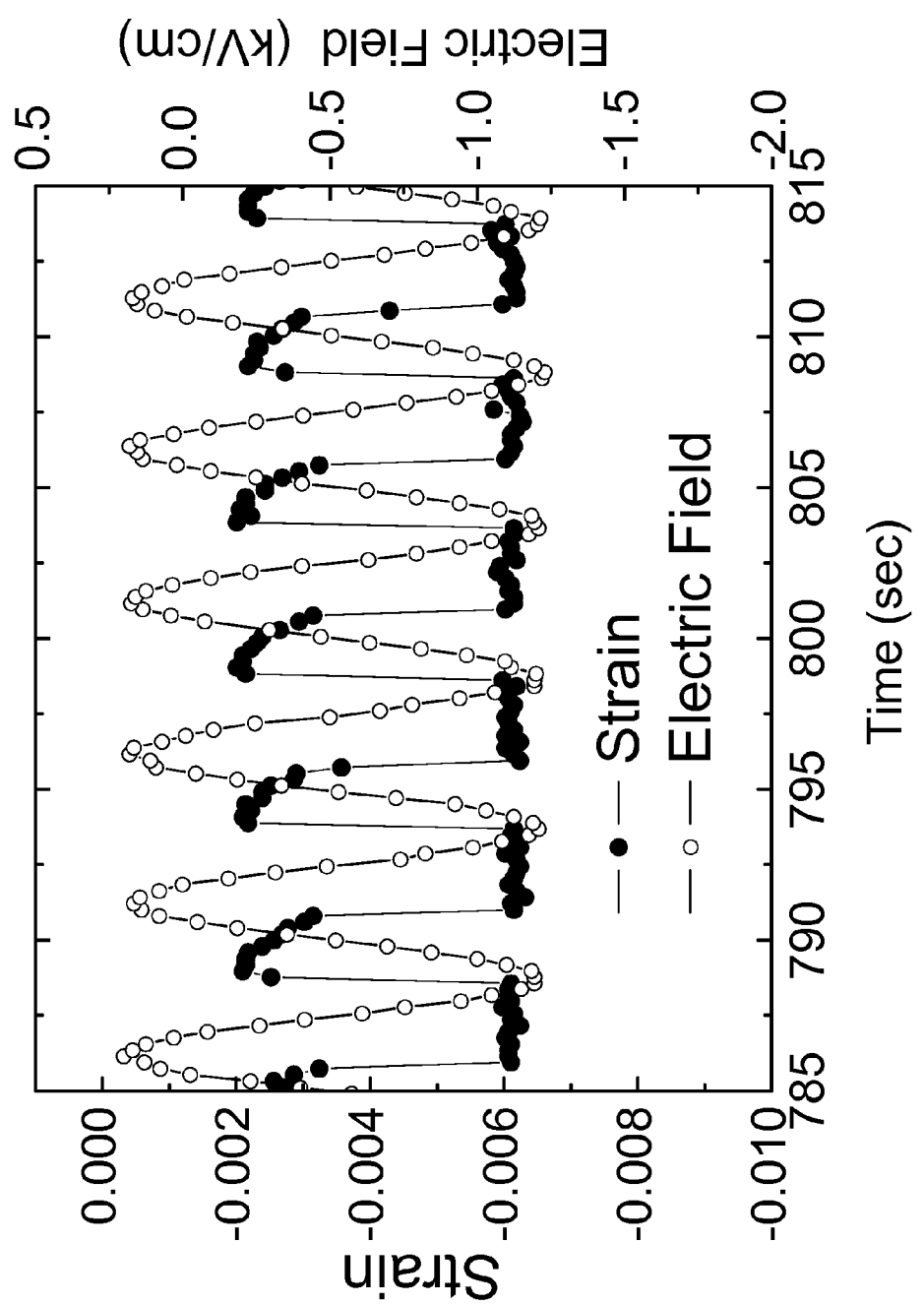
FIG. 2 is a graph showing an applied electric field superimposed with the strain response for a single crystal piezoelectric material undergoing phase change.

FIG. 2 provides a graph of an applied electrical field versus time superimposed with the strain response of the single crystal piezoelectric material. The applied electrical field is indicated with hollow, circular datums, and the strain response is shown with filled, circular datums. The applied electrical field is a sine wave. The strain response is similar to a square wave; however, there are some features worth noting. The linear response region, shown in FIG. 1 as 12A and 12B, is the angled region shown at the top of the strain response curve in FIG. 2. The phase transition occurs in the vertical region of the strain response curve. Another linear response region is evident at the bottom of the curve. In this material at this phase, additional voltage doesn't result in a significant amount of additional strain.

In application, the single crystal piezoelectric material begins with an initial strain (~-0.002) when the applied electric field is near zero and the pre-stress is about 10 MPa. When the electric field approaches about -1 KV/cm induced phase transition strain is about -0.006 with a total strain of ~0.004. The strain curve levels out once the phase transition is complete. As shown by the remainder of the electric field and strain curves, this process can be repeated periodically with essentially the same strain response.

Strain caused by crystalline ferroelectric phase change can be distinguished from that caused by ordinary piezoelectric strain by the magnitude of the strain. PZT composite ceramics have a piezoelectric coefficient of around 200 pm/V and are capable of inducing a strain of ~0.00002 ($2\times10^{-5}$). Single crystal piezoelectric materials when operated in the linear mode have a piezoelectric coefficient of ~2000 pm/V. For the drive field E (max) ~100,000 V/m, the generated strain is ~0.0002 ($2\times10^{-4}$). In the phase change piezoelectric single crystals used in the current invention, generated strain can range from ~0.001 ($1\times10^{-3}$) to possibly as high as ~0.008 ($8\times10^{-3}$). Experimentation has shown strain values of 0.004 ($4\times10^{-3}$) with an electric field of ~0.1-0.2 MV/m when the material is subjected to a pre-stress of at least 10-20 MPa.

These crystals can be driven in the "32" mode or in the "33" mode. FIG. 3A shows crystal orientation for driving in the "32" mode, and FIG. 3B shows crystal orientation for driving in the "33" mode. In FIG. 3A, stress $\sigma_{22}$ and strain $\epsilon_{22}$ occur in the direction indicated by arrow 22. The $X_1$ axis is in the direction given by the vector $[0\bar{1}1]$. The $X_2$ axis is in the direction given by the vector [100], and the $X_3$ axis is in the direction given by the vector [011]. The arrows indicated by $P_s$ and vector directions $[\bar{1}11]$ and [111] show possible polarization vectors for these materials driven in the "32" mode. Strain in direction 22 is responsive to an electric field in the direction indicated by arrow 24.

FIG. 3B shows a piezoelectric crystal driven in the "33" mode having stress $\sigma_{33}$ and strain $\epsilon_{33}$ in the direction indicated by arrow 26. This is in response to an electric field generated in the direction indicated by arrow 28. The crystal has axes $X_1$ in the direction given by the vector [100], $X_2$ in the direction given by [010], and $X_3$ in the direction [001]. Possible polarizations are indicated at the vectors identified as $P_s$ in directions [111], $[1\bar{1}1]$, $[\bar{1}11]$, and $[\bar{1}\bar{1}1]$.

Figure 4:
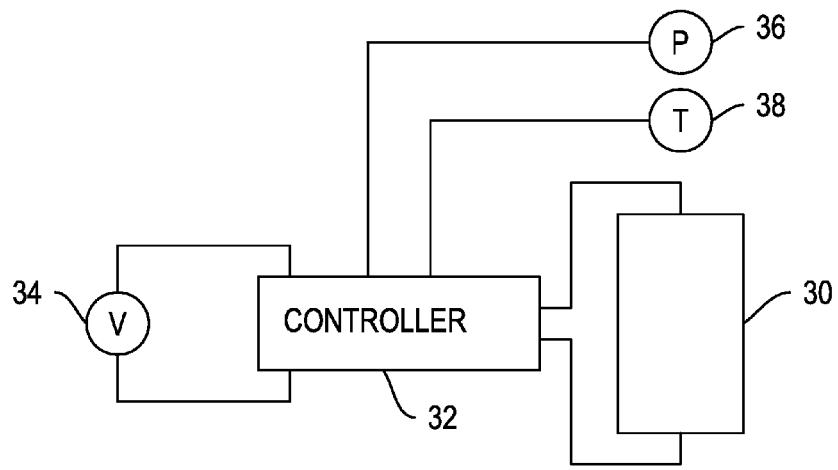
FIG. 4 is a diagram of an apparatus for utilizing a phase change piezoelectric crystal.

FIG. 4 provides a schematic for an apparatus joined to a phase change transducer 30. The phase change transducer 30 has electrodes joined to a controller 32. The electrodes can be connected in either a "33" mode wherein the electric field is provided in the same direction as the strain or in a "32" mode wherein the electric field is orthogonal to the strain. Controller 32 is joined to a voltage source 34. Controller 32 is also joined to a pressure sensor 36 and a temperature sensor 38. Pressure sensor 36 and temperature sensor 38 are positioned to detect environmental conditions affecting transducer 30. Controller 32 provides a base level of voltage to transducer 30 dependent on the environmental conditions. This allows controller to create a pre-stress in transducer 30 that is calculated based on the environmental conditions to place transducer 30 near the phase transition point indicated at 16 or 18 of FIG. 1. The calculated pre-stress can be based on experimental data or theoretical information related to the single crystal or the crystalline composition.

Figure 5:
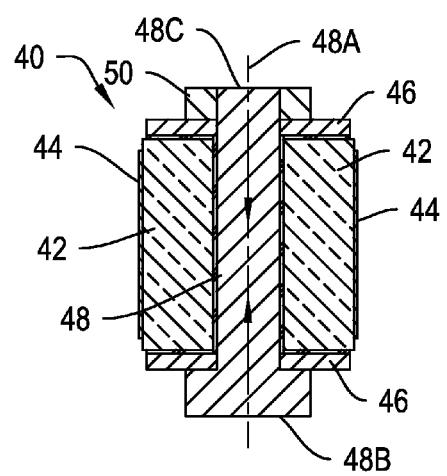
FIG. 5 is a cross-sectional view of an embodiment of a phase change transducer utilizing a mechanical pre-stress.

FIG. 5 shows an embodiment of the mechanical arrangement of a phase change transducer 40 capable of creating a mechanical pre-stress in a transducer crystal 42. This embodiment shows a "32" mode transducer. Electrodes 44 are positioned on opposing sides of crystal 42. Electrodes 44 can be joined to an electrical field source (not shown). Crystal 42 is positioned between stress plates 46. A stress bolt 48 having an axis 48A is positioned to compress stress plates 46. Bolt 48 has a head 48B at a first end and threads 48C at a second end. Compression can be adjusted by a nut 50 positioned on threaded end 48C of stress bolt 48. Tension in bolt 48 results in an adjustable pre-stress in crystal 42. Crystal 42 and electrodes 44 should be insulated from plates 46 and bolt 48, if these items are conductive.

In "32" mode operation, an increase or decrease in the electric field applied to electrodes 44 causes a phase change in crystal 42. This results in positive or negative strain along axis 48A of bolt 48. Because piezoelectric materials are reciprocal, a change in stress applied along axis 48A also results in an electrical field being generated between electrodes 44.

Figure 6:
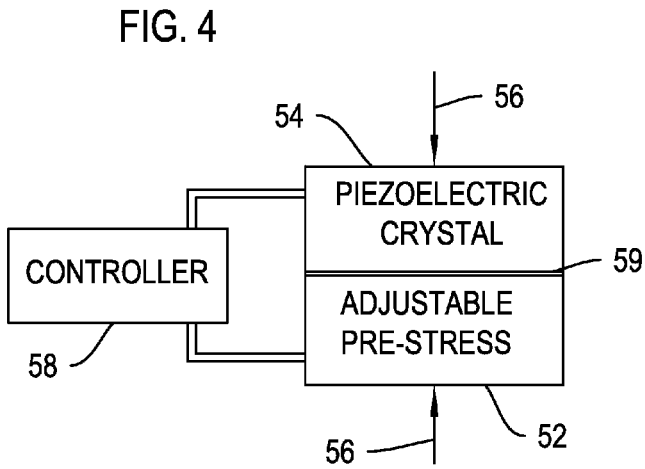
FIG. 6 is a diagram of an apparatus utilizing a phase change crystal with an electronically adjustable pre-stress.

FIG. 6 provides a diagram showing an embodiment using an electrically controllable, adjustable pre-stress 52. In this embodiment, a piezoelectric crystal 54 is mechanically joined to the adjustable pre-stress 52. The crystal 54 and adjustable pre-stress 52 assembly is subjected to a mechanical pre-stress or containment as indicated by arrows 56. Adjustable pre-stress 52, crystal 54 and mechanical pre-stress 56 are in series such that an increase in one component causes an increase in the stress of all of the components. Adjustable pre-stress 52 and crystal 54 are separately joined to a controller 58. Insulating material 59 can be positioned between adjustable pre-stress 52 and crystal 54. Adjustable pre-stress 52 can be a piezoelectric composite or single crystal material, a magnetostrictive material, or some other material capable of increasing its dimension in response to controller 58. In the case of a piezoelectric material, controller 58 can provide an electrical field to the piezoelectric adjustable pre-stress 52, increasing or decreasing its dimension and thereby changing the pre-stress in the assembly. In the case of a magnetostrictive material, controller 58 can increase current in a coil which subjects the magnetostrictive material to a magnetic field. This increases the relevant dimension in the magnetostrictive material resulting in increased or decreased pre-stress in the assembly. These are merely examples of an electrically controlled, adjustable pre-stress, and it is envisioned that other structures known in the art could provide this functionality. Optionally, controller 58 can be joined to sensors such as those shown in FIG. 4.

Figure 7:
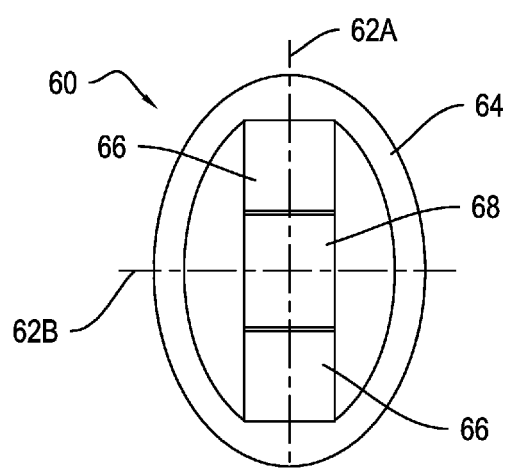
FIG. 7 is a diagram of a phase change transducer configured as a flextensional transducer.

FIG. 7 shows another embodiment of the current invention. This embodiment shows the apparatus formed as a flextensional type of transducer 60. Small displacements along the semi-major axis 62A result in large displacements along the semi-minor axis 62B providing an efficient low frequency transducer. In flextensional transducer 60, a flexing shell 64 acts as the mechanical pre-stress. The resonance frequency of transducer is determined by the flexing shell 64 size and material. Phase change crystals 66 are positioned in series with an electrically controllable, pre-stress component 68. Pre-stress component 68 can be a magnetostrictive transducer or a separately controlled piezoelectric transducer.

For high strain, phase change operation, flexing shell 64 applies a static stress to the single crystals 66 by way of the shell's 64 elasticity. This compressive stress brings the single crystals 66 close to the phase transition point. To excite the transducer 60, pre-stress component 68 provides a dynamic stress that causes the single crystals 66 to change state. Releasing this stress causes crystals 66 to return to the original state. The required dynamic stress is related to how close the static stress can come to the phase transition point and remain stable. As provided previously the dynamic stress can be generated electrically by the piezoelectric effect through the crystals 66 or through an external magnetostrictive or electrostrictive actuator such as pre-stress component 68. Pre-stress component can adjust static stress as needed, for example, to compensate for changes in pressure and temperature that would affect the shell's 64 compressive load.

Figure 8:
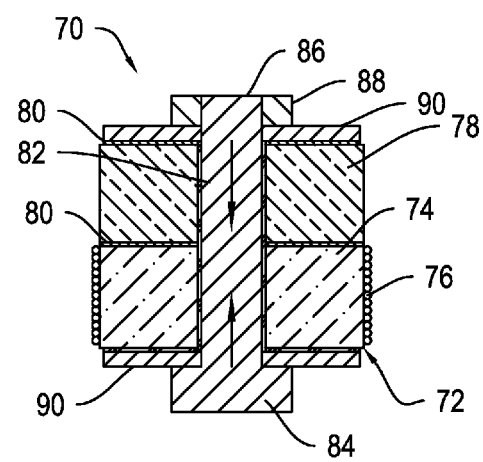
FIG. 8 is a diagram of a phase change transducer configured as a Tonpilz transducer employing mechanical pre-stress, adjustable electronic pre-stress and a single piezoelectric crystal.

FIG. 8 shows a cross-sectional view of another transducer 70 utilizing a Tonpilz configuration with a magnetostrictive pre-stress component 72. Magnetostrictive pre-stress component 72 can be a magnetostrictive material 74 (i.e., TERFENOL or GALFENOL) positioned within a solenoid coil 76. Using a variable current source, solenoid coil 76 can provide a magnetic field which acts on the magnetostrictive material 74 to induce a static stress. Magnetostrictive pre-stress component 72 is joined to a piezoelectric phase change single crystal 78. Electrodes 80 are positioned to provide an electric field through single crystal 78 causing strain in the electric field direction. This provides a "33" mode piezoelectric transducer. Mechanical pre-stress is applied to magnetostrictive pre-stress component 72 and phase change single crystal 78 by a tension bolt 82 having a bolt head 84 at a first end. A second end 86 is threaded and fitted with a nut 88. Bolt head 84 and nut 88 apply compression to compression plates 90 positioned next to the combined magnetostrictive pre-stress component 72 and phase change single crystal 78. Tension bolt 82 provides a static pre-stress to component 72 and crystal 78. The static pre-stress positions crystal 78 near its phase change point.

Current supplied to solenoid coil 76 increases the critical dimension of magnetostrictive material 74 and causes additional stress in crystal 78. This stress can be controlled to optimize phase change in crystal 78 in view of varying environmental conditions. Crystal 78 can then operate in the passive mode in which compression of crystal 78 causes a phase change and results in the creation of a an electric field, or, in the active mode, in which an electromagnetic field causes a phase change resulting in strain in the transducer.

Figure 9:
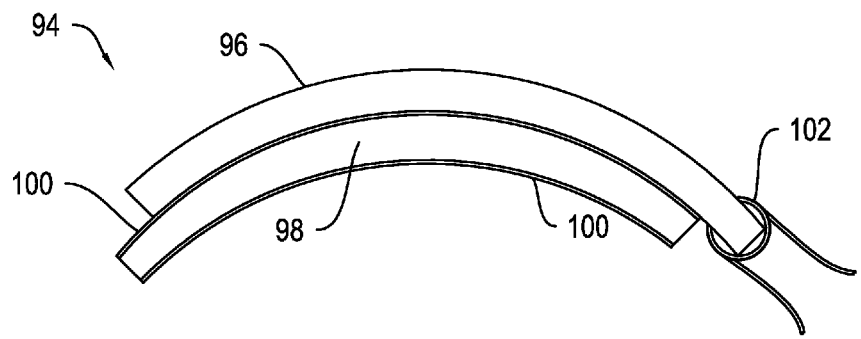
FIG. 9 is a diagram of a phase change transducer configured as a bender bar transducer.

In FIG. 9, there is shown a diagram of a bender bar embodiment 94 of the phase change transducer. In this embodiment, a bending bar 96 made from a magnetostrictive material is bonded to a single crystal layer 98 such that the single crystal layer 98 is held in compression. Electrodes 100 are in contact with the outer surface and inner surface of the bent crystal layer 98. Applying an electric field to the electrodes 100 causes strain in the crystal layer 98. Magnetostrictive material 96 is joined to a coil 102. Pre-stress in crystal layer 98 can be adjusted by providing an electrical current to coil 102 which causes a stress in bending bar 96. As in other embodiments, external stress can induce an electric field in single crystal layer 98 allowing for passive operation of the embodiment 94.

It will be understood that additional variations and alternatives in the details, materials, steps and arrangement of parts, which have been herein described and illustrated in order to explain the nature of the invention, may be made as understood by those skilled in the art within the principles and scope of the invention as expressed in the appended claims. The foregoing description of the preferred embodiments of the invention has been presented for purposes of illustration and description only. It is not intended to be exhaustive nor to limit the invention to the precise form disclosed; and obviously many modifications and variations are possible in light of the above teaching. Such modifications and variations that may be apparent to a person skilled in the art are intended to be included within the scope of this invention as defined by the accompanying claims.

What is claimed is:

1. A piezoelectric transducer comprising:
    a single crystal piezoelectric material having a phase transition from one crystalline phase to a second crystalline phase at a predetermined stress level wherein said single crystal piezoelectric material is ternary lead indium niobate-lead magnesium niobate-lead titanate (PIN-PMN-PT);
    a means for applying a pre-stress to said single crystal piezoelectric material; and an electrical field source joined to provide an electrical field across said single crystal piezoelectric material and capable of having sufficient magnitude in cooperation with said means for applying a pre-stress to cause said single crystal piezoelectric material to change phase from one crystalline phase to the second crystalline phase.

2. The transducer of claim 1 wherein said single crystal piezoelectric material is $xPb(In_{1/2}Nb_{1/2})O_3$-$(1-x-y)Pb(Mg_{1/3}Nb_{2/3})O_3$-$yPbTiO_3$ where x is greater than about 0.24 and less than about 0.33 and y is greater than about 0.28 and less than about 0.33.

3. A piezoelectric transducer comprising:
a single crystal piezoelectric material having a phase transition from one crystalline phase to a second crystalline phase at a predetermined stress level;
a means for applying a pre-stress to said single crystal piezoelectric material; and
an electrical field source joined to provide an electrical field across said single crystal piezoelectric material and capable of having sufficient magnitude in cooperation with said means for applying a pre-stress to cause said single crystal piezoelectric material to change phase from one crystalline phase to the second crystalline phase;
wherein said means for applying a pre-stress comprises:
a mechanical compression means;
an electrically activated component positioned between said mechanical compression means and said single crystal piezoelectric material, said component being capable of changing size when activated; and
a controller joined to said electrically activated component.

4. The transducer of claim 3 wherein said electrically activated component is made from a piezoelectric ceramic material.

5. The transducer of claim 3 wherein said electrically activated component comprises:

a magnetostrictive material positioned between said mechanical compression means and said single crystal piezoelectric material; and
a coil joined to said controller and positioned to establish a magnetic circuit through said magnetostrictive material.

6. The transducer of claim 3 further comprising at least one environmental sensor joined to provide environmental information to said controller, said controller being capable of controlling said electrically activated component in response to said environmental information.

7. The transducer of claim 6 wherein said at least one environmental sensor is a temperature gauge providing temperature information.

8. The transducer of claim 6 wherein said at least one environmental sensor is a pressure gauge providing pressure information.

9. The transducer of claim 6 wherein said at least one environmental sensor comprises:
a pressure gauge providing pressure information; and
a temperature gauge providing temperature information.

10. A transducer comprising:
a single crystal piezoelectric material having a phase transition from one crystalline phase to a second crystalline phase at a predetermined stress level;
a mechanical pre-stress means joined to said single crystal piezoelectric material; and
an electrically activated component positioned between said mechanical compression means and said single crystal piezoelectric material, said component being capable of changing size when activated, said mechanical pre-stress means and said electrically activated component being capable of applying pre-stress to said single crystal piezoelectric material near the predetermined stress level.

\* \* \* \* \*